(12) United States Patent
Murata et al.

(10) Patent No.: US 12,289,049 B2
(45) Date of Patent: Apr. 29, 2025

(54) POWER SUPPLY CONTROL APPARATUS

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Hayaki Murata, Yokkaichi (JP); Koki Sakakibara, Yokkaichi (JP); Ryohei Sawada, Yokkaichi (JP); Shunichi Sawano, Yokkaichi (JP); Kota Oda, Yokkaich (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 225 days.

(21) Appl. No.: 17/996,404

(22) PCT Filed: Mar. 15, 2021

(86) PCT No.: PCT/JP2021/010268
§ 371 (c)(1),
(2) Date: Oct. 17, 2022

(87) PCT Pub. No.: WO2021/215138
PCT Pub. Date: Oct. 28, 2021

(65) Prior Publication Data
US 2023/0208290 A1 Jun. 29, 2023

(30) Foreign Application Priority Data
Apr. 20, 2020 (JP) ................. 2020-074813

(51) Int. Cl.
| | | |
|---|---|---|
| *H02M 3/155* | (2006.01) | |
| *H02M 1/00* | (2006.01) | |
| *H03K 17/082* | (2006.01) | |

(52) U.S. Cl.
CPC ......... *H02M 3/155* (2013.01); *H02M 1/0003* (2021.05); *H03K 17/0822* (2013.01)

(58) Field of Classification Search
CPC . H02M 3/155; H02M 1/0003; H03K 17/0822
(Continued)

(56) References Cited

U.S. PATENT DOCUMENTS 9,807,837 B2 * 10/2017 Seki ................. H05B 45/395
11,165,337 B2 * 11/2021 Hiasa ................. H02M 1/4208
(Continued)

FOREIGN PATENT DOCUMENTS

| JP | 2010-93434 A | 4/2010 |
|---|---|---|
| JP | 2011-85470 A | 4/2011 |
| JP | 2012-54804 A | 3/2012 |

OTHER PUBLICATIONS

International Application No. PCT/JP2021/010268, mailed May 25, 2021. ISA/Japan Patent Office.

*Primary Examiner* — Yemane Mehari
(74) *Attorney, Agent, or Firm* — Honigman, LLP

(57) ABSTRACT

A power supply control apparatus controls power supply from a DC power source to a load by switching on or off a power supply FET. The current adjustment circuit adjusts the current flowing through the resistor circuit to a value obtained by dividing the voltage between the drain and the source of the power supply FET by the resistance value of the resistor circuit. A drive circuit switches off the power supply FET when a voltage across the detection resistor exceeds a predetermined voltage. The on-resistance value of the power supply FET fluctuates according on the ambient temperature of the power supply FET. The resistance value
(Continued)

of the resistor circuit fluctuates in the same direction as the on-resistance value according to the ambient temperature of the power supply FET.

11 Claims, 10 Drawing Sheets

(58) Field of Classification Search
USPC .......................................................... 323/282
See application file for complete search history.

(56) References Cited

U.S. PATENT DOCUMENTS

| | | | |
|---|---|---|---|
| 11,942,927 B2 * | 3/2024 | Purcarea | H03K 17/0822 |
| 2005/0275990 A1 * | 12/2005 | Ohshima | H03K 17/0822 |
| | | | 361/103 |
| 2014/0347141 A1 * | 11/2014 | Shibayama | G06F 13/4086 |
| | | | 333/17.3 |
| 2018/0331556 A1 * | 11/2018 | Sugisawa | H02J 7/00 |
| 2018/0358806 A1 * | 12/2018 | Mase | G05F 1/573 |
| 2019/0199305 A1 * | 6/2019 | Sugie | H02K 41/0354 |
| 2019/0267795 A1 * | 8/2019 | Oda | H02H 7/12 |

* cited by examiner $$Ith = \frac{Rt \cdot Vr}{Rs \cdot Ra}$$

Ith : Current threshold value
Rt : Resistance value of resistor circuit
Rs : Resistance value of detection resistor
Ra : ON-resistance value of power supply FET
Vr : Reference voltage (Condition for keeping current threshold value ITH at target current IG)

$$\frac{Rt}{Ra} = \underbrace{\frac{Rs \cdot Ig}{Vr}}_{\text{Constant}}$$

FIG. 5

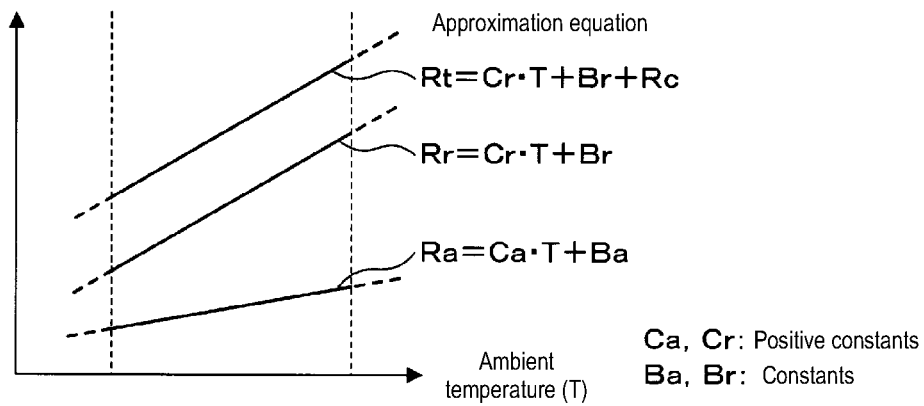

Method for determining resistance value Rc of series resistor

Approximation equation
$Rt = Cr \cdot T + Br + Rc$
$Rr = Cr \cdot T + Br$
$Ra = Ca \cdot T + Ba$ Ambient temperature (T)

$Ca, Cr$: Positive constants
$Ba, Br$: Constants $$\frac{Rt}{Ra} = \frac{Cr \cdot T + Br + Rc}{Ca \cdot T + Ba}$$

$$= \frac{Cr}{Ca} \cdot \frac{Ca \cdot T + \frac{Ca \cdot (Br + Rc)}{Cr}}{Ca \cdot T + Ba}$$

$$Rc = \frac{Cr \cdot Ba}{Ca} - Br \quad \text{When } Rc = Cr \cdot Ba/CaBr \text{ is satisfied}$$

$$\frac{Rt}{Ra} = \frac{Cr}{Ca} \quad \text{(Constant)}$$

POWER SUPPLY CONTROL APPARATUS

CROSS-REFERENCE TO RELATED APPLICATIONS

This application is the U.S. national stage of PCT/JP2021/010268 filed on Mar. 15, 2021, which claims priority of Japanese Patent Application No. JP 2020-074813 filed on Apr. 20, 2020, the contents of which are incorporated herein.

TECHNICAL FIELD

The present disclosure relates to a power supply control apparatus.

BACKGROUND

JP 2011-85470A discloses a power supply control apparatus for a vehicle that controls power supply from a power source to a load by switching on or off a MOSFET (Metal Oxide Semiconductor Field Effect Transistor) that functions as a semiconductor switch. In this power supply control apparatus, the drain and source of the MOSFET are arranged in a first current path of the current from the power source to the load. The power supply control apparatus described in JP 2011-85470A is further provided with a second current path for current flowing from the power source to a resistor. The current flowing through the second current path is adjusted to a current proportional to a voltage between the drain and source of the MOSFET.

The voltage between the drain and source of the MOSFET is expressed as the product of the current flowing through the first current path and an on-resistance value of the MOSFET. The on-resistance value is the resistance value between the drain and source of the MOSFET when the MOSFET is on. The on-resistance value of the MOSFET varies depending on the temperature of the MOSFET.

In the power supply control apparatus described in JP 2011-85470A, an analog value is converted into a digital value for the voltage across the resistor. A computation element calculates the current flowing through the MOSFET based on the voltage across the resistor represented by a digital value and the ambient temperature of the MOSFET that fluctuates in the same manner as the temperature of the MOSFET. If the current calculated by the computation element is large, the MOSFET is switched off. This prevents overcurrent from flowing through the MOSFET.

Regarding JP 2011-85470A, it takes a long time to calculate the current flowing through the MOSFET. For this reason, the power supply control apparatus described in JP 2011-85470A is problematic in that the MOSFET cannot be turned off immediately when the current flowing through the MOSFET is large.

In view of this, it is an object of the present invention to provide a power supply control apparatus capable of switching off a semiconductor switch at an appropriate timing without calculating a current flowing through the semiconductor switch.

SUMMARY

A power supply control apparatus according to one aspect of the present disclosure is a power supply control apparatus for controlling power supply by switching on or off a semiconductor switch through which current flows, the power supply control apparatus including: a resistor circuit with one terminal connected to one terminal on an upstream side of the semiconductor switch; a current adjustment circuit configured to adjust a current flowing through the resistor circuit to a value obtained by dividing a voltage across the semiconductor switch by a resistance value of the resistor circuit; a resistor arranged on a current path of the current flowing through the resistor circuit; and a switch circuit configured to switch off the semiconductor switch if the voltage across the resistor exceeds a predetermined voltage, in which an on-resistance value of the semiconductor switch fluctuates according to an ambient temperature of the semiconductor switch, and the resistance value of the resistor circuit fluctuates in the same direction as the on-resistance value according to the ambient temperature.

Advantageous Effects of the Present Disclosure

According to the present disclosure, the semiconductor switch can be switched off at an appropriate timing without calculating the current flowing through the semiconductor switch.

BRIEF DESCRIPTION OF DRAWINGS

FIG. 5 is an illustrative diagram of a method for determining a resistance value of a series resistor.

DETAILED DESCRIPTION OF PREFERRED EMBODIMENTS

Figure 1:
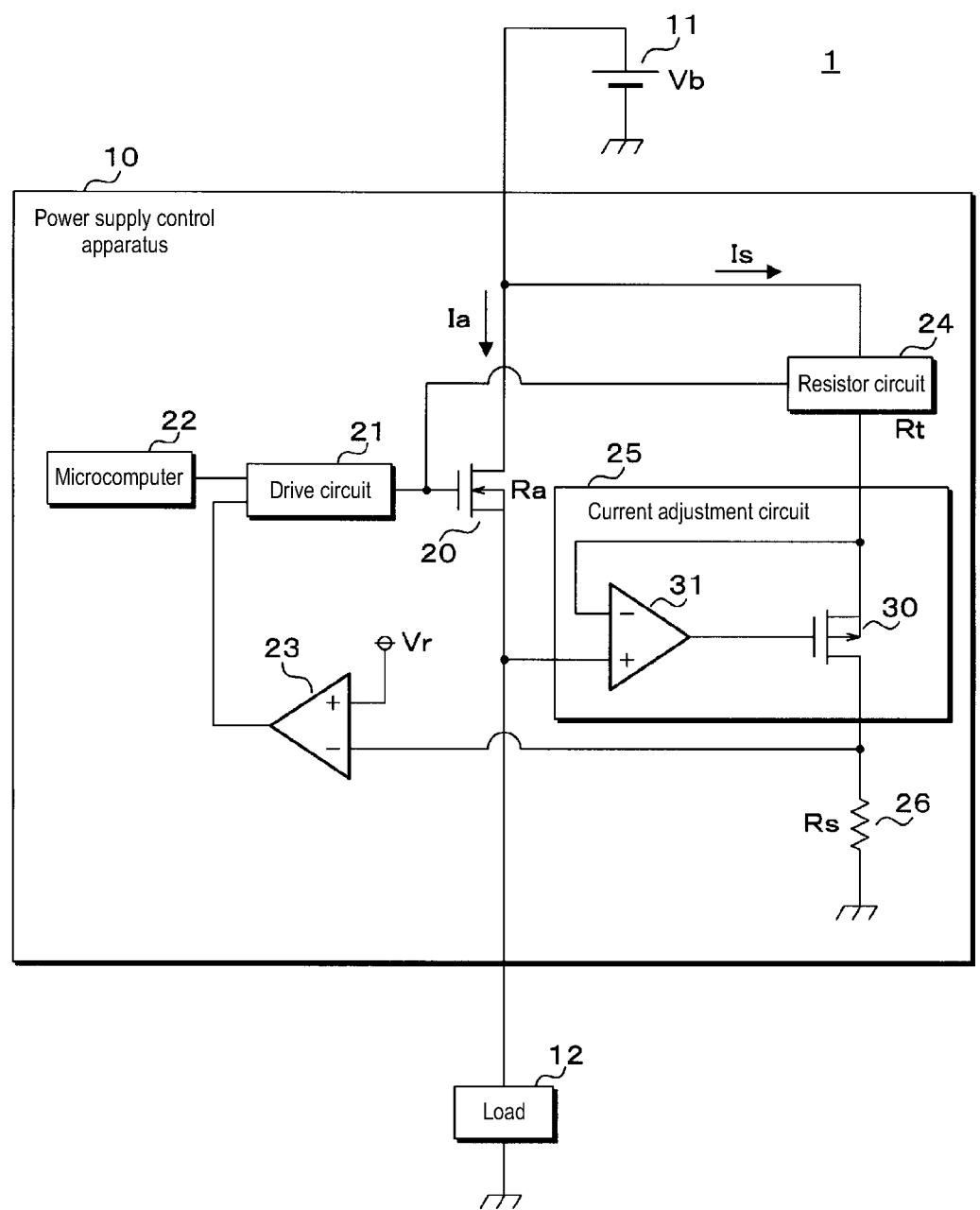
FIG. 1 is a block diagram showing a configuration of main portions of a power source system according to a first embodiment.

First, embodiments of the present disclosure will be listed and described. At least some of the embodiments described below may be combined as appropriate.

First Aspect

A power supply control apparatus according to a first aspect of the present disclosure is a power supply control apparatus for controlling power supply by switching on or off a semiconductor switch through which current flows, the power supply control apparatus including: a resistor circuit with one terminal connected to one terminal on an upstream side of the semiconductor switch; a current adjustment circuit configured to adjust a current flowing through the resistor circuit to a value obtained by dividing a voltage across the semiconductor switch by a resistance value of the resistor circuit; a resistor arranged on a current path of the current flowing through the resistor circuit; and a switch circuit configured to switch off the semiconductor switch if the voltage across the resistor exceeds a predetermined voltage, in which an on-resistance value of the semiconductor switch fluctuates according to an ambient temperature of the semiconductor switch, and the resistance value of the resistor circuit fluctuates in the same direction as the on-resistance value according to the ambient temperature.

In the above-described first aspect, the current flowing through the resistor circuit is represented by (voltage across semiconductor switch)/(resistance value of resistor circuit). The voltage across the semiconductor switch is represented by the product of the current flowing through the semiconductor switch and the on-resistance value of the semiconductor switch. The on-resistance value of the semiconductor switch and the resistance value of the resistor circuit fluctuate in the same direction according to the ambient temperature of the semiconductor switch. For this reason, even if the ambient temperature of the semiconductor switch fluctuates, the current flowing through the resistor hardly fluctuates at all. The voltage across the resistor hardly fluctuates according to the ambient temperature of the semiconductor switch, and is proportional to the current flowing through the semiconductor switch. If the voltage across the resistor exceeds a predetermined voltage, the semiconductor switch is switched off assuming that the current flowing through the semiconductor switch is large. In this manner, the semiconductor switch can be switched off at an appropriate timing without calculating the current flowing through the semiconductor switch.

Second Aspect

In a power supply control apparatus according to a second aspect of the present disclosure, the resistor circuit includes a second semiconductor switch, the switching unit switches on the second semiconductor switch if the semiconductor switch has been switched on, and the on-resistance value of the second semiconductor switch fluctuates in the same direction as the on-resistance value of the semiconductor switch according to the ambient temperature of the semiconductor switch.

In the above-described second aspect, the second semiconductor switch is arranged in the resistor circuit, and the on-resistance value of the second semiconductor switch fluctuates in the same direction as the on-resistance value of the semiconductor switch according to the ambient temperature of the semiconductor switch. For this reason, the resistance value of the resistor circuit fluctuates in the same direction as the on-resistance value of the semiconductor switch according to the ambient temperature of the semiconductor switch.

As the second semiconductor switch, for example, a switch having the same structure as that of the semiconductor switch is used. Specifically, if the semiconductor switch is a MOSFET, a MOSFET is used as the second semiconductor switch. In this case, it is possible to easily realize a resistor circuit in which the resistance value fluctuates in the same manner as the on-resistance value of the semiconductor switch according to the ambient temperature of the semiconductor switch.

Third Aspect

In a power supply control apparatus according to a third aspect of the present disclosure, the resistor circuit includes a series resistor that is connected in series to the second semiconductor switch.

In the above-described third aspect, if the ratio between the on-resistance value of the semiconductor switch and the resistance value of the resistor circuit is constant regardless of the ambient temperature of the semiconductor switch, the current threshold value for the current flowing through the semiconductor switch is constant regardless of the ambient temperature of the semiconductor switch. In this case, the semiconductor switch can be switched off at an appropriate timing. It is assumed that the ratio between the on-resistance value of the semiconductor switch and the on-resistance value of the second semiconductor switch is not constant regardless of the ambient temperature. Even in this case, by connecting a series resistor in series to the second semiconductor switch, it is possible to realize a configuration in which the ratio between the on-resistance value of the semiconductor switch and the resistance value of the resistor circuit is constant regardless of the ambient temperature of the semiconductor switch.

Fourth Aspect

In the power supply control apparatus according to a fourth aspect of the present disclosure, the resistor circuit includes a parallel resistor that is connected in parallel to a series circuit of the second semiconductor switch and a series resistor.

In the above-described fourth aspect, it is assumed that the ratio between the on-resistance value of the semiconductor switch and the on-resistance value of the second semiconductor switch is not constant regardless of the ambient temperature. Even in this case, by connecting a series resistor in series to the second semiconductor switch and connecting a parallel resistor in parallel to the series circuit, it is possible to realize a configuration in which the ratio between the on-resistance value of the semiconductor switch and the resistance value of the resistor circuit is constant regardless of the ambient temperature of the semiconductor switch.

Fifth Aspect

In a power supply control apparatus according to a fifth aspect of the present disclosure, the resistor circuit includes a parallel resistor that is connected in parallel to the second semiconductor switch.

In the above-described fifth aspect, a parallel resistor is connected in parallel to the second semiconductor switch. As a result, the resistance value decreases from the on-resistance value of the second semiconductor switch to the resistance value of the parallel circuit of the second semiconductor switch and the parallel resistor.

Sixth Aspect

In the power supply control apparatus according to a sixth aspect of the present disclosure, the current adjustment circuit includes: a variable resistor; and a resistance adjustment unit configured to adjust a resistance value of the variable resistor such that voltages at terminals on a downstream side of the semiconductor switch and the resistor circuit match each other.

In the above-described sixth aspect, the resistance value of the variable resistor is adjusted such that the voltages at terminals on the downstream side of the semiconductor switch and the resistor circuit match each other. As a result, the current flowing through the resistor circuit is adjusted to a value obtained by dividing the voltage across the semiconductor switch by the resistance value of the resistor circuit.

Specific examples of the power supply system according to the embodiment of the present disclosure will be described below with reference to the drawings. Note that the present invention is not limited to these examples, but is indicated by the claims, and is intended to include all modifications within the meaning and scope equivalent to the claims.

First Embodiment

Configuration of Power Source System

FIG. 1 is a block diagram showing a main configuration of a power source system 1 according to a first embodiment.

The power source system 1 is preferably mounted in a vehicle and includes a power supply control apparatus 10, a DC power supply 11, and a load 12. The DC power source 11 is, for example, a battery. The load 12 is an electric device mounted in a vehicle.

The power supply control apparatus 10 has a power supply FET 20 for controlling power supply from the DC power source 11 to the load 12. The power supply FET 20 is an N-channel MOSFET and functions as a semiconductor switch. The drain and source of the power supply FET 20 are connected to the positive electrode of the DC power source 11 and one terminal of the load 12, respectively. The negative electrode of the DC power source 11 and the other terminal of the load 12 are grounded.

When the state of the power supply FET 20 is on, the resistance value between the drain and the source is small, and a current can flow through the drain and the source. The on-resistance value of the power supply FET 20 is the resistance value between the drain and the source of the power supply FET 20 when the power supply FET 20 is on. When the power supply FET 20 is on, current flows from the positive electrode of the DC power source 11 in the order of the power supply FET 20, the load 12, and the negative electrode of the DC power source 11, and power is supplied to the load 12. When power is supplied to the load 12, the load 12 operates.

When the state of the power supply FET 20 is off, the resistance value between the drain and the source is sufficiently large, and no current flows through the drain and the source. When the power supply FET 20 is off, no power is supplied to the load 12. When the power supply FET 20 is switched off, the power supply to the load 12 is stopped, and the load 12 stops operation.

The power supply control apparatus 10 controls the power supply from the DC power source 11 to the load 12 by switching the power supply FET 20 on or off.

Configuration of Power Supply Control Apparatus 10

The power supply control apparatus 10 includes a drive circuit 21, a microcomputer 22, a comparator 23, a resistor circuit 24, a current adjustment circuit 25, and a detection resistor 26, in addition to the power supply FET 20. The resistor circuit 24 has an input terminal to which a current is input, an output terminal from which a current is output, and a control terminal. The current adjustment circuit 25 includes an adjustment FET 30 for adjusting the current and a differential amplifier 31. The comparator 23 and the differential amplifier 31 each have a positive terminal, a negative terminal, and an output terminal. The adjustment FET 30 is a P-channel FET (Field Effect Transistor).

The drive circuit 21 is connected to the gate of the power supply FET 20. The drive circuit 21 is further connected to the microcomputer 22 and the output terminal of the comparator 23. The drain and gate of the power supply FET 20 are connected to the input terminal and the control terminal of the resistor circuit 24, respectively. The output terminal of the resistor circuit 24 is connected to the source of the adjustment FET 30 of the current adjustment circuit 25. The drain of the adjustment FET 30 is connected to one terminal of the detection resistor 26. The other terminal of the detection resistor 26 is grounded. In the current adjustment circuit 25, the source and the gate of the adjustment FET 30 are connected to the negative terminal and the output terminal of the differential amplifier 31, respectively. The positive terminal of the differential amplifier 31 is connected to the source of the power supply FET 20. One terminal of the detection resistor 26 is further connected to the negative terminal of the comparator 23.

The drive circuit 21 outputs a voltage. The output voltage of the drive circuit 21 is applied to the gate of the power supply FET 20 and the control terminal of the resistor circuit 24. The reference potential of the output voltage of the drive circuit 21 is the ground potential. When the output voltage of the drive circuit 21 is a voltage greater than or equal to a first on voltage, the power supply FET 20 is on. The state of the resistor circuit 24 includes an on state in which a current can flow through the resistor circuit 24 and an off state in which a current does not flow through the resistor circuit 24. When the output voltage of the drive circuit 21 is a voltage greater than or equal to a second on voltage, the resistor circuit 24 is on.

If the output voltage of the drive circuit 21 is less than the first off voltage, the power supply FET 20 is off. If the output voltage of the drive circuit 21 is less than the second off voltage, the resistor circuit 24 is off. The first on voltage exceeds the first off voltage. The first off voltage is a positive voltage. Similarly, the second on voltage exceeds the second off voltage. The second off voltage is a positive voltage.

The drive circuit 21 switches the power supply FET 20 and the resistor circuit 24 on by adjusting the output voltage to a voltage higher than the first on voltage and the second on voltage. The drive circuit 21 switches the power supply FET 20 and the resistor circuit 24 off by adjusting the output voltage to a voltage lower than the first off voltage and the second off voltage. When the power supply FET 20 is on, as described above, current flows through the power supply FET 20, and power is supplied from the DC power source 11 to the load 12. At this time, in the power supply FET 20, the current flows in the order of the drain and the source of the power supply FET 20. Accordingly, in the path of current flowing through the power supply FET 20, the drain and the source of the power supply FET 20 are terminals on the upstream side and the downstream side, respectively. When the power supply FET 20 is off, the power supply to the load 12 is stopped as described above. Hereinafter, the current flowing through the power supply FET 20 is referred to as a switch current.

When the resistor circuit 24 is on, current flows from the positive electrode of the DC power source 11 in the order of the resistor circuit 24, the adjustment FET 30 of the current adjustment circuit 25, and the detection resistor 26. In the resistor circuit 24, the current flows in the order of the input terminal and the output terminal. Accordingly, in the current path of the current flowing through the resistor circuit 24, the input terminal and the output terminal are terminals on the upstream side and the downstream side, respectively. Hereinafter, the current flowing through the resistor circuit 24 is referred to as a resistor current. In the current path of the resistor current, the adjustment FET 30 of the current adjustment circuit 25 is arranged on the downstream side of the resistor circuit 24, and the detection resistor 26 is arranged on the downstream side of the adjustment FET 30 of the current adjustment circuit 25. When the resistor circuit 24 is off, the flowing of the current through the resistor circuit 24 is stopped.

The microcomputer 22 and the comparator 23 each output a high-level voltage and a low-level voltage to the drive circuit 21. The reference potential of the high-level voltage and the low-level voltage is the ground potential. The high-level voltage is higher than the low-level voltage. The drive circuit 21 switches on or off the power supply FET 20 and the resistor circuit 24 based on the output voltages of the microcomputer 22 and the comparator 23.

The microcomputer 22 switches the output voltage to the high-level voltage when the load 12 is to be operated. The microcomputer 22 switches the output voltage to the low-level voltage when the operation of the load 12 is to be stopped. A constant predetermined voltage is applied to the positive terminal of the comparator 23. The predetermined voltage is a positive voltage and is generated, for example, by a regulator stepping down the output voltage of the DC power source 11. The reference potential of the predetermined voltage is the ground potential. A voltage at one terminal of the detection resistor 26 whose reference potential is the ground potential, that is, a voltage across the detection resistor 26, is applied to the negative terminal of the comparator 23. Hereinafter, the voltage across the detection resistor 26 will be referred to as the detection voltage. The comparator 23 switches the output voltage from the low-level voltage to the high-level voltage when the detected voltage becomes a voltage that is less than or equal to the predetermined voltage. The comparator 23 switches the output voltage from the high-level voltage to the low-level voltage when the detected voltage exceeds a predetermined voltage.

In the current adjustment circuit 25, the differential amplifier 31 outputs a voltage whose reference potential is the ground potential. The output voltage of the differential amplifier 31 is applied to the gate of the adjustment FET 30. The higher the output voltage of the differential amplifier 31 is, the greater the resistance value between the drain and the source of the adjustment FET 30 is. The lower the output voltage of the differential amplifier 31 is, the smaller the resistance value between the drain and the source of the adjustment FET 30 is. The differential amplifier 31 adjusts the resistance value between the drain and the source of the adjustment FET 30 by adjusting the output voltage. The adjustment FET 30 and the differential amplifier 31 function as a variable resistor and a resistance adjustment unit, respectively.

Hereinafter, the voltage of the source of the power supply FET 20 is referred to as a switch voltage. The voltage at the output terminal of the resistor circuit 24 is referred to as a resistor voltage. The reference potential of the switch voltage and the resistor voltage is the ground potential. The differential amplifier 31 adjusts the output voltage to a higher voltage the higher the difference voltage calculated by subtracting the resistor voltage from the switch voltage is.

The differential amplifier 31 raises the output voltage when the switch voltage rises to a voltage higher than the resistor voltage. At this time, the larger the difference voltage between the switch voltage and the resistor voltage is, the larger the increase in the output voltage of the differential amplifier 31 is. Due to the increase in the output voltage of the differential amplifier 31, the resistance value between the drain and the source of the adjustment FET 30 increases, and the current flowing through the resistor circuit 24 decreases. As a result, the amount of the voltage drop generated in the resistor circuit 24 decreases, and the resistor voltage increases.

The differential amplifier 31 reduces the output voltage when the switch voltage drops to a voltage lower than the resistor voltage. At this time, the larger the absolute value of the difference voltage between the switch voltage and the resistor voltage is, the larger the decrease in the output voltage of the differential amplifier 31 is. Due to the decrease in the output voltage of the differential amplifier 31, the resistance value between the drain and the source of the adjustment FET 30 decreases, and the current flowing through the resistor circuit 24 increases. As a result, the amount of the voltage drop generated in the resistor circuit 24 increases, and the resistor voltage decreases.

As described above, the differential amplifier 31 adjusts the resistance value between the drain and the source of the adjustment FET 30 such that the switch voltage and the resistor voltage match each other. The voltage across the DC power source 11 is denoted as Vb. The on-resistance value of the power supply FET 20 is denoted as Ra. The switch current flowing through the power supply FET 20 is denoted as Ia. The resistance value of the resistor circuit 24 when the resistor circuit 24 is on is denoted as Rt. The resistor current flowing through the resistor circuit 24 is denoted as Is. When the power supply FET 20 is on, the switch voltage is expressed by (Vb−Ra·Ia). "·" indicates a product. When the resistor circuit 24 is on, the resistor voltage is expressed by (Vb−Rt·Is).

Since the switch voltage matches the resistor voltage, the following equation holds true when the power supply FET 20 and the resistor circuit 24 are on.

$$Vb-Ra \cdot Ia = Vb - Rt \cdot Is$$

By expanding this equation, the following equation can be obtained.

$$Is = Ra \cdot Ia / Rt$$

Accordingly, the differential amplifier 31 adjusts the resistor current Is to (Ra Ia/Rt) when the resistor circuit 24 is on. Ra Ia is the voltage across the power supply FET 20 when the power supply FET 20 is on.

The resistance value and detection voltage of the detection resistor 26 are expressed by Rs and Vd, respectively. Since the detection voltage Vd is expressed by Rs·Is and the resistor current Is is expressed by (Ra·Ia/Rt), the following equation holds true.

$$Vd = Rs \cdot Ra \cdot Ia / Rt$$

The predetermined voltage applied to the positive terminal of the comparator 23 is denoted as Vr. The output voltage of the comparator 23 is a high-level voltage when Vr≥Vd is satisfied. In Vr≥Vd, the following equation is obtained by substituting (Rs·Ra·Ia/Rt) for Vd.

$$Vr \geq Rs \cdot Ra \cdot Ia / Rt$$

By expanding this equation, the following equation can be obtained.

$$Ia \leq (Rt \cdot Vr)/(Rs \cdot Ra)$$

The output voltage of the comparator 23 is a low-level voltage when Vr<Vd is satisfied. In Vr<Vd, (Rs·Ra·Ia/Rt) is substituted for Vd and the equation is expanded. As a result, the following equation is obtained.

$$Ia > (Rt \cdot Vr)/(Rs \cdot Ra)$$

The current threshold value Ith is defined as in the following equation.

$$Ith = (Rt \cdot Vr)/(Rs \cdot Ra)$$

The comparator 23 switches the output voltage to the high-level voltage when the switch current Ia is less than or equal to the current threshold value Ith, and switches the output voltage to the low-level voltage when the switch current Ia exceeds the current threshold value Ith.

When the power supply FET 20 and the resistor circuit 24 are off, no current flows through the load 12 and no current flows through the detection resistor 26. For this reason, since the switch voltage and the resistor voltage are zero V, the differential amplifier 31 stops adjusting the output voltage. When the resistor circuit 24 is off, no current flows through the detection resistor 26, and therefore the detection voltage is zero V. Since the predetermined voltage is a positive voltage, zero V is a voltage that is less than or equal to the predetermined voltage Vr. Accordingly, when the power supply FET 20 and the resistor circuit 24 are off, the comparator 23 outputs a high-level voltage.

Operations of Power Supply Control Apparatus 10

Figure 2:
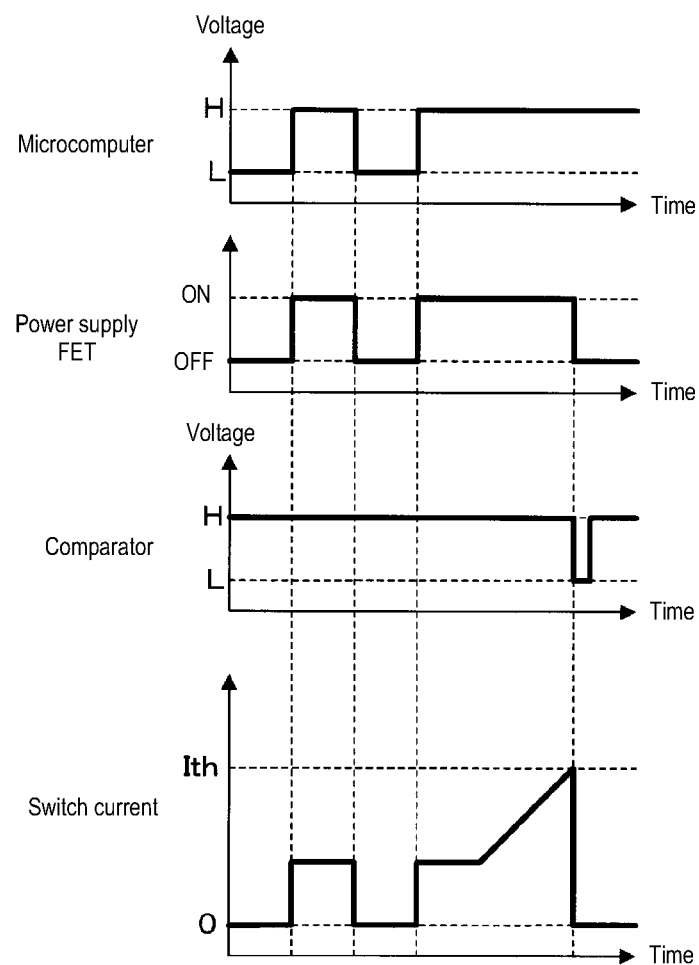
FIG. 2 is a timing chart for describing operations of a power supply control apparatus.

FIG. 2 is a timing chart for describing the operations of the power supply control apparatus 10. FIG. 2 shows transitions in the output voltage of the microcomputer 22, the state of the power supply FET 20, the output voltage of the comparator 23, and the switch current. Time is shown on the horizontal axis of these transitions. In FIG. 2, the high-level voltage and the low-level voltage are indicated by H and L, respectively. When the output voltage of the microcomputer 22 is a low-level voltage, the drive circuit 21 keeps the power supply FET 20 off, and therefore the switch current is zero A. When the power supply FET 20 is off, the resistor circuit 24 is also off, and therefore the output voltage of the comparator 23 is a high-level voltage.

When the microcomputer 22 switches the output voltage from the low-level voltage to the high-level voltage, the drive circuit 21 switches the power supply FET 20 on regardless of the output voltage of the comparator 23. As a result, the switch current flows through the power supply FET 20, and the switch current rises from zero A. If the power source system 1 is normal, when the power supply FET 20 is on, the switch current is less than or equal to the current threshold value Ith.

As described above, when the power supply FET 20 is switched on, the drive circuit 21 also switches on the resistor circuit 24. Accordingly, when the power supply FET 20 is on, a detection voltage proportional to the switch current is applied to the comparator 23. Here, since the switch current is less than or equal to the current threshold value Ith, the comparator 23 continues to output a high-level voltage.

When the microcomputer 22 switches the output voltage from the high-level voltage to the low-level voltage, the drive circuit 21 switches off the power supply FET 20 regardless of the output voltage of the comparator 23. As a result, the switch current drops to zero A. As described above, when the power supply FET 20 is switched off, the drive circuit 21 also switches off the resistor circuit 24. For this reason, the detected voltage drops to zero V. The comparator 23 continues to output the high-level voltage.

As described above, when the microcomputer 22 switches the output voltage from the low-level voltage to the high-level voltage, the drive circuit 21 switches on the power supply FET 20, and the switch current flows through the power supply FET 20. When the power supply FET 20 is on and the switch current is a current less than or equal to the current threshold value Ith, the comparator 23 outputs a high-level voltage. It is assumed that a failure has occurred in the power source system 1 and the switch current has increased. The failure is, for example, a short circuit between both terminals of the load 12.

When the switch current exceeds the current threshold value Ith, the comparator 23 switches the output voltage from the high-level voltage to the low-level voltage. When the output voltage of the comparator 23 is switched from the high-level voltage to the low-level voltage while the output voltage of the microcomputer 22 is the high-level voltage, the drive circuit 21 switches off the power supply FET 20. As a result, the switch current drops to zero A. When the power supply FET 20 is switched off, the drive circuit 21 also switches off the resistor circuit 24, and therefore the detection voltage drops to zero V. As a result, the comparator 23 switches the output voltage from the low-level voltage to the high-level voltage. The drive circuit 21 keeps the power supply FET 20 off until the output voltage of the microcomputer 22 switches from the low-level voltage to the high-level voltage. The drive circuit 21 functions as a switching circuit.

As described above, since the drive circuit 21 switches off the power supply FET 20 when the switch current exceeds the current threshold value Ith, it is possible to prevent an overcurrent from flowing through the power supply FET 20. When an overcurrent flows through the power supply FET 20, there is a possibility that the temperature of the power supply FET 20 will rise to an abnormal temperature. At this time, a failure may occur in the power supply FET 20.

Temperature Dependence of On-Resistance Value of Power Supply FET 20

Figure 3:
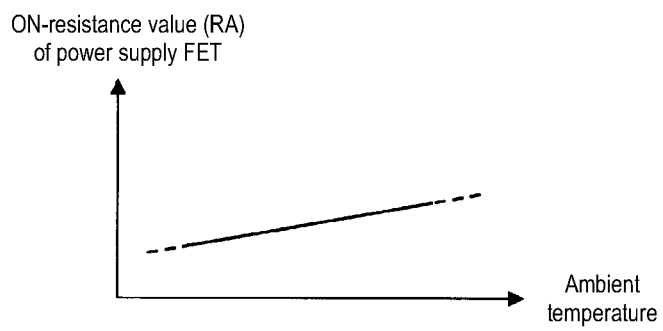
FIG. 3 is a graph showing a relationship between an on-resistance value of a power supply FET and an ambient temperature.

FIG. 3 is a graph showing the relationship between the on-resistance value Ra of the power supply FET 20 and the ambient temperature. When the switch current flows through the power supply FET 20, the power supply FET 20 generates heat and the temperature of the power supply FET 20 rises. The ambient temperature of the power supply FET 20 fluctuates in the same manner as the temperature of the power supply FET 20. The on-resistance value Ra of the power supply FET 20 fluctuates according to the temperature of the power supply FET 20, that is, the ambient temperature of the power supply FET 20. As shown in FIG. 3, the on-resistance value Ra of the power supply FET 20 increases the higher the ambient temperature of the power supply FET 20 is.

As described above, the current threshold value Ith is represented by (Rt Vr)/(Rs Ra). Here, Rt, Vr, and $R_s$ are the resistance value of the resistor circuit 24, the predetermined voltage, and the resistance value of the detection resistor 26, respectively. The current threshold value Ith is preferably constant regardless of the temperature of the power supply FET 20, that is, the ambient temperature of the power supply FET 20. However, the on-resistance value Ra of the power supply FET 20 fluctuates according to the ambient temperature of the power supply FET 20.

The resistance value Rt of the resistor circuit 24 fluctuates in the same direction as the on-resistance value of the power supply FET 20 according to the ambient temperature of the power supply FET 20. It is assumed that the on-resistance value of the power supply FET 20 rises to twice the on-resistance value before the rise due to the rise in the ambient temperature of the power supply FET 20. In this case, if the resistance value Rt of the resistor circuit 24 rises to twice the resistance value before the rise, the current threshold value Ith does not fluctuate.

In order to maintain the current threshold value Ith at a constant target current Ig, it is necessary to satisfy the following equation.

$$Rt/Ra = Rs \cdot Ig/Vr$$

Here, since the resistance value Rs of the detection resistor 26 is constant regardless of the ambient temperature of the power supply FET 20, (Rs Ig/Vr) is a constant. As the resistor circuit 24, a circuit may be designed in which the ratio between the resistance value Rt of the resistor circuit 24 and the on-resistance value Ra of the power supply FET 20 is maintained at a constant value even when the ambient temperature of the power supply FET 20 fluctuates. As a result, the current threshold value Ith is maintained at a constant target current Ig regardless of the ambient temperature of the power supply FET 20.

Configuration of Resistor Circuit 24

Figure 4:
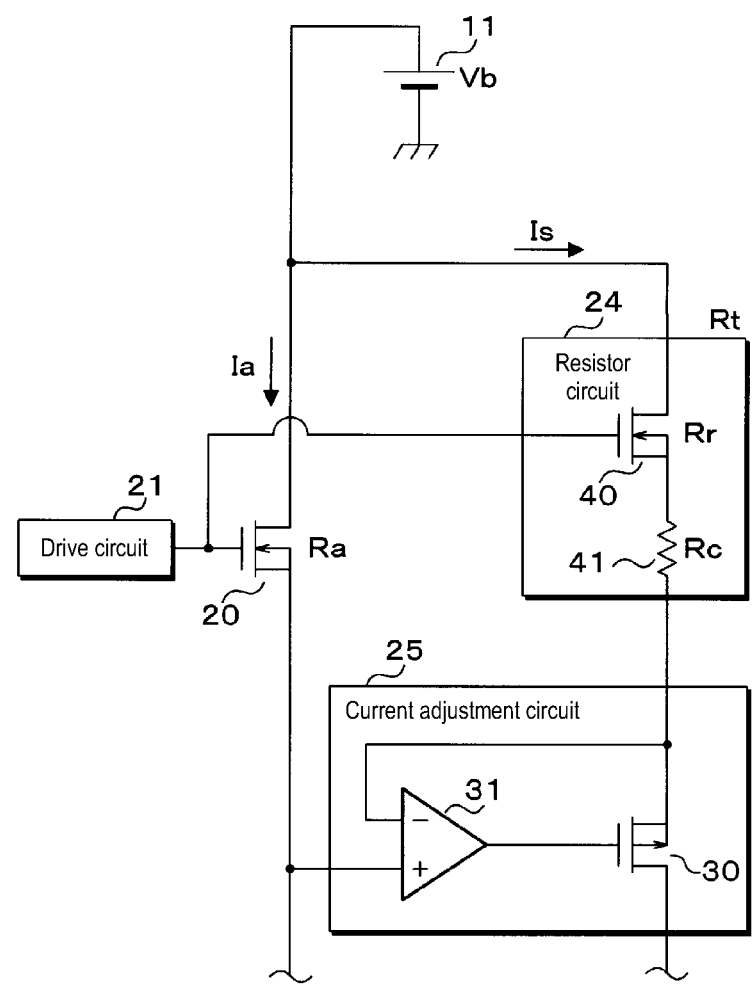
FIG. 4 is a circuit diagram of a resistor circuit.

FIG. 4 is a circuit diagram of the resistor circuit 24. The resistor circuit 24 has a circuit FET 40 and a series resistor 41. The circuit FET 40 is an N-channel MOSFET and functions as a second semiconductor switch. The drain and gate of the circuit FET 40 are connected to the drain and gate of the power supply FET 20, respectively. One terminal of the series resistor 41 is connected to the source of the circuit FET 40. The other terminal of the series resistor 41 is connected to the source of the adjustment FET 30 of the current adjustment circuit 25. The drain and gate of the circuit FET 40 are the input terminal and the control terminal of the resistor circuit 24, respectively. The other terminal of the series resistance 41 is the output terminal of the resistor circuit 24.

As described above, the series resistor 41 is connected in series with the circuit FET 40.

When the output voltage of the drive circuit 21 is equal to or higher than the second on voltage, the circuit FET 40 is on. For the circuit FET 40, when the state is on, the resistance between the drain and the source is small and current can flow through the drain and the source. The circuit FET 40 being on means the resistor circuit 24 being on. The on-resistance value of the circuit FET 40 is the resistance value between the drain and the source of the circuit FET 40 when the circuit FET 40 is on. When the circuit FET 40 is on, current flows from the positive electrode of the DC power source 11 in the order of the circuit FET 40, the series resistor 41, the adjustment FET 30, and the detection resistor 26.

If the output voltage of the drive circuit 21 is less than the second off voltage, the circuit FET 40 is off. For the circuit FET 40, when the state is off, the resistance between the drain and the source is large enough that no current flows through the drain and the source. The circuit FET 40 being off means the resistor circuit 24 being off. When the circuit FET 40 is off, no current flows through the resistor circuit 24.

When the power supply FET 20 is switched on, the drive circuit 21 also switches on the circuit FET 40. When the power supply FET 20 is switched off, the drive circuit 21 also switches off the circuit FET 40.

The circuit FET 40 is arranged, for example, in the vicinity of the power supply FET 20. For this reason, the on-resistance value of the circuit FET 40 fluctuates according to the ambient temperature of the power supply FET 20. As described above, both the power supply FET 20 and the circuit FET 40 are N-channel MOSFETs, and the structures of the power supply FET 20 and the circuit FET 40 are the same. For this reason, the on-resistance value of the circuit FET 40 fluctuates in the same direction as the on-resistance value of the power supply FET 20 according to the ambient temperature of the power supply FET 20. Accordingly, when the on-resistance value of the power supply FET 20 rises due to the ambient temperature of the power supply FET 20 changing, the on-resistance value of the circuit FET 40 also rises.

Since the resistor circuit 24 has the circuit FET 40, the resistance value of the resistor circuit 24 fluctuates in the same direction as the on-resistance value of the power supply FET 20 according to the ambient temperature of the power supply FET 20. The resistor circuit 24 can be easily realized by using an FET having the same structure as the power supply FET 20 as the circuit FET 40.

By connecting a series resistor 41 in series to the circuit FET 40, the ratio between the resistance value of the resistor circuit 24 and the on-resistance value of the power supply FET 20 when the circuit FET 40 is on can be adjusted to be a constant value.

The on-resistance value of the circuit FET 40 and the resistance value of the series resistor 41 are denoted as Rx and Rc, respectively. The resistance value Rt of the resistor circuit 24 when the circuit FET 40 is on is expressed by (Rr+Rc). The resistance value Rc of the series resistor 41 is constant regardless of the ambient temperature of the power supply FET 20.

Parameter Design

FIG. 5 is an illustrative diagram of a method for determining the resistance value Rc of the series resistor 41. Here, an example of parameter design will be described. FIG. 5 shows the relationship between the ambient temperature of the power supply FET 20 and the on-resistance value Ra of the power supply FET 20, the on-resistance value Rr of the circuit FET 40, and the resistance value Rt of the resistor circuit 24, respectively. As described above, Rt is the resistance value of the resistor circuit 24 when the circuit FET 40 is on.

FETs whose on-resistance values change linearly within a pre-set ambient temperature range are used as the power supply FET 20 and the circuit FET 40. Accordingly, the equation indicating the relationship between the on-resistance value Ra and the ambient temperature of the power supply FET 20 and the equation indicating the relationship between the on-resistance value Rx and the ambient temperature of the circuit FET 40 can be expressed by linear equations.

The ambient temperature of the power supply FET 20 is denoted as T. The relationship between the on-resistance value Ra and the ambient temperature T of the power supply FET 20 is expressed by the following approximate expression.

$$Ra = Ca \cdot T + Ba$$

Ca is a positive constant. Ba is a constant. The on-resistance value Ra of the power supply FET 20 is expressed by a linear function of the ambient temperature T of the power supply FET 20.

The relationship between the on-resistance value Rx and the ambient temperature T of the circuit FET 40 is expressed by the following approximate expression.

$$Rr = Cr \cdot T + Br$$

Cr is a positive constant. Br is a constant. The on-resistance value Rr of the circuit FET 40 is expressed by a linear function of the ambient temperature T of the power supply FET 20.

The resistance value of the series resistor 41 is denoted as Rc. The resistance value Rt of the resistor circuit 24 is expressed by the following equation.

$$Rt = Rr + Rc$$

By substituting Rr=Cr T+Br into this equation, the following approximate equation is obtained.

$$Rt = Cr \cdot T + Br + Rc$$

Accordingly, the ratio between the resistance value Rt of the resistor circuit 24 and the on-resistance value Ra of the power supply FET 20 is expressed by the following approximate expression.

$$Rt/Ra = (Cr \cdot T + Br + Rc)/(Ca \cdot T + Ba)$$

By expanding this equation, the following equation is obtained.

$$Rt/Ra = (Cr/Ca) \cdot (Ca\ T + (Ca \cdot (Br + Rc)/Cr))/((Ca \cdot T) + Ba)$$

As described above, when the ratio between the resistance value Rt of the resistor circuit 24 and the on-resistance value Ra of the power supply FET 20 is constant, the current threshold value is constant regardless of the ambient temperature T of the power supply FET 20 (see FIG. 3). Accordingly, when the following equation is satisfied, the ratio between the resistance value Rt of the resistor circuit 24 and the on-resistance value Ra of the power supply FET 20 is constant.

$$Ca \cdot (Br+Rc)/Cr = Ba$$

By expanding this equation, the following equation can be obtained.

$$Rc = (Cr \cdot Ba/Ca) - Br$$

Accordingly, when a resistor for which the resistance value is ((Cr Ba/Ca)—Br) is used as the series resistor 41, a configuration is realized in which the current threshold value is constant regardless of the ambient temperature T of the power supply FET 20. In this case, the following equation holds true.

$$Rt/Ra = Cr/Ca$$

As described above, the ratio between the resistance value Rt of the resistor circuit 24 and the on-resistance value Ra of the power supply FET 20 is also expressed by the following equation.

$$Rt/Ra = Rs \cdot Ig/Vr$$

As described above, Rs, Ig, and Vr are the resistance value, the target current, and the predetermined voltage of the detection resistor 26, respectively.

Accordingly, after determining the resistance value Rc of the series resistance 41, the resistance value Rs of the detection resistor 26, the target current Ig, and the predetermined voltage Vr may be determined such that the following equation is satisfied.

$$Rs \cdot Ig/Vr = Cr/Ca$$

Effect of Power Supply Control Apparatus 10

The on-resistance value of the power supply FET 20 and the resistance value of the resistor circuit 24 fluctuate in the same direction according to the ambient temperature of the power supply FET 20. For this reason, even if the ambient temperature of the power supply FET 20 fluctuates, the current flowing through the detection resistor 26 hardly changes. The voltage across the detection resistor 26 hardly fluctuates according to the ambient temperature of the power supply FET 20, and is proportional to the switch current flowing through the power supply FET 20. When the voltage across the detection resistor 26 exceeds a predetermined voltage, the drive circuit 21 switches the power supply FET 20 off, assuming that the switch current has exceeded the current threshold value. In this manner, the drive circuit 21 can switch off the power supply FET 20 at an appropriate timing without calculating the switch current based on the voltage across the detection resistor 26.

It is assumed that the ratio between the on-resistance value of the power supply FET 20 and the on-resistance value of the circuit FET 40 is not constant regardless of the ambient temperature. Even in this case, by connecting the series resistor 41 in series to the circuit FET 40 as in the power supply control apparatus 10, it is possible to realize a configuration in which the ratio between the on-resistance value of the power supply FET 20 and the resistance value of the resistor circuit 24 is constant regardless of the ambient temperature of the power supply FET 20.

Second Embodiment

In the resistor circuit 24 of the power supply control apparatus 10 in the first embodiment, the series resistor 41 is connected in series to the circuit FET 40. However, the configuration of the resistor circuit 24 is not limited to this configuration.

Hereinafter, the differences between the second embodiment and the first embodiment will be described. Other configurations except the later-described configurations are the same as those in the first embodiment. For this reason, the configurational parts that are the same as those in the first embodiment are denoted by the same reference numerals as those in the first embodiment, and description thereof is omitted.

Configuration of Resistor Circuit 24

Figure 6:
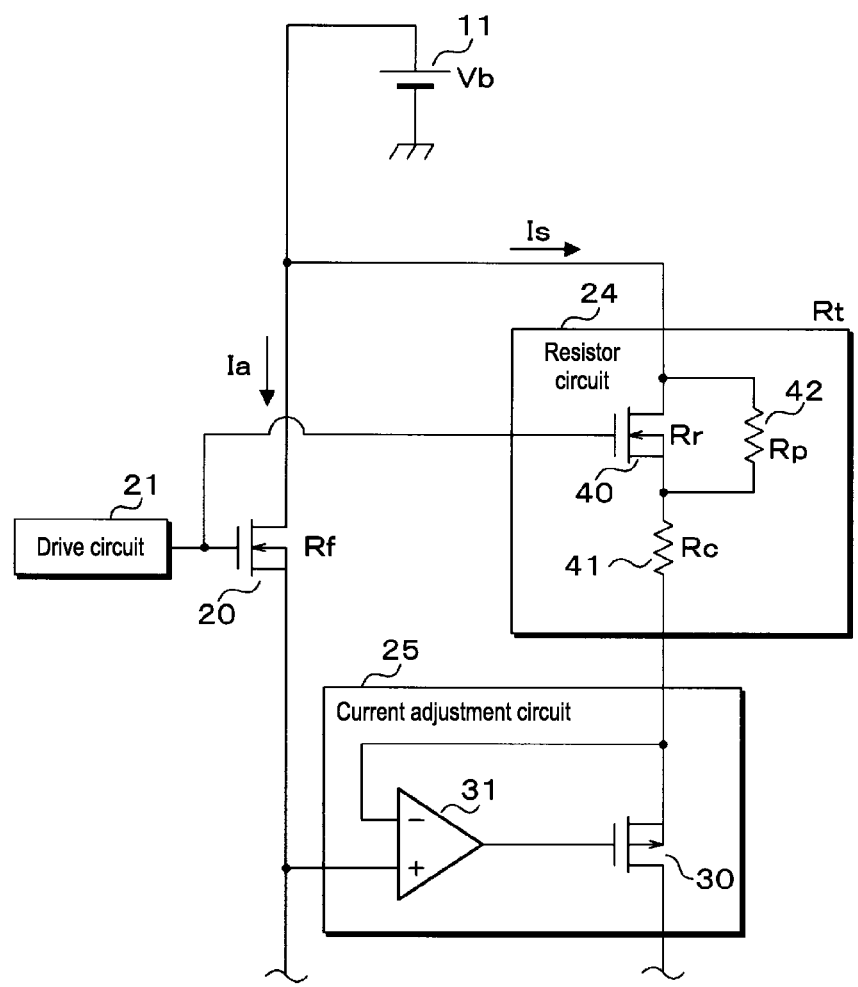
FIG. 6 is a circuit diagram of a resistor circuit according to a second embodiment.

FIG. 6 is a circuit diagram of the resistor circuit 24 in the second embodiment. The resistor circuit 24 in the second embodiment has a parallel resistor 42 in addition to the circuit FET 40 and the series resistor 41. The parallel resistor 42 is connected between the drain and source of the circuit FET 40. In this manner, the parallel resistor 42 is connected in parallel to the circuit FET 40.

Accordingly, in the second embodiment, the resistor current flows through the resistor circuit 24 not only when the circuit FET 40 is on but also when the circuit FET 40 is off. The resistance value of the parallel resistor 42 is denoted as Rp. The resistance value Rp of the parallel resistor 42 is constant regardless of the ambient temperature of the power supply FET 20. The resistance value Rt of the resistor circuit 24 is (Rr·Rp/(Rr+Rp))+Rc. As described in the description of the first embodiment, Rr and Rc are the on-resistance value of the circuit FET 40 and the resistance value of the series resistor 41, respectively. Rt is the resistance value of the resistor circuit 24 when the circuit FET 40 is on. The resistance value of the resistor circuit 24 when the circuit FET 40 is off is (Rp+Rc).

Operations of Power Supply Control Apparatus 10

When the power supply FET 20 is off, the switch voltage is zero V, and therefore the differential amplifier 31 lowers the voltage of the gate of the adjustment FET 30 in order to lower the resistor voltage. As a result, when the power supply FET 20 is off, the resistance value between the drain and source of the adjustment FET 30 is adjusted to a sufficiently small value. When the power supply FET 20 is off, the circuit FET 40 is off and the voltage across the DC power source 11 is divided by the resistor circuit 24 and the detection resistor 26. The divided voltage obtained by dividing the voltage across the DC power source 11 is applied to the negative terminal of the comparator 23. The divided voltage when the circuit FET 40 is off exceeds the predetermined voltage Vr.

Figure 7:
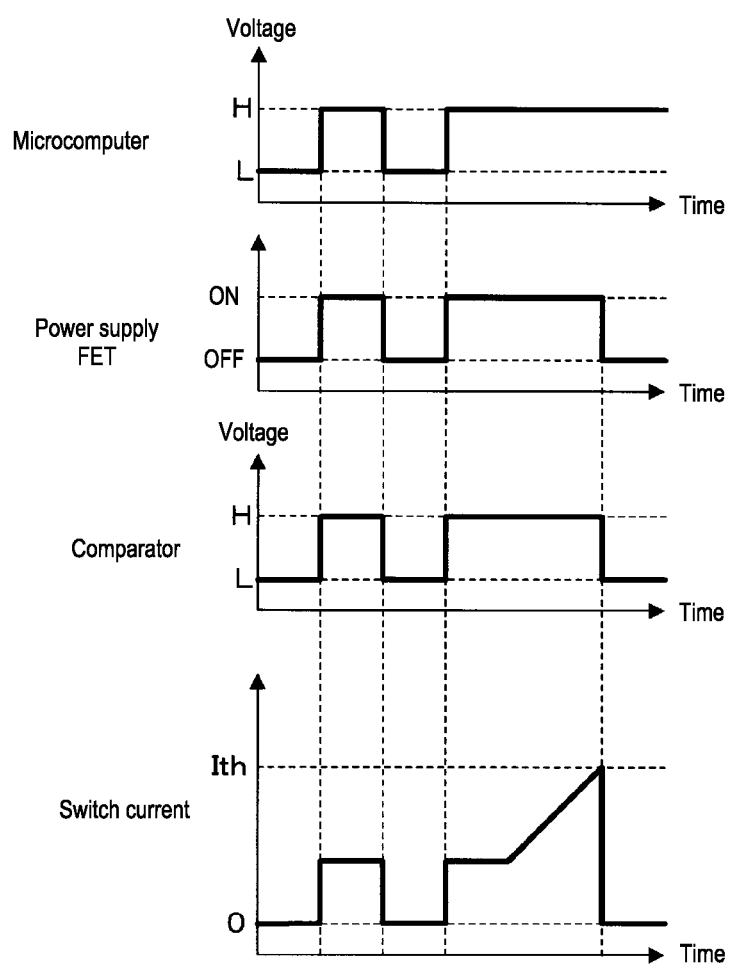
FIG. 7 is a timing chart for describing operations of the power supply control apparatus.

FIG. 7 is a timing chart for describing the operations of the power supply control apparatus 10. FIG. 7 corresponds to FIG. 2. Similarly to FIG. 2, FIG. 7 shows transitions in the output voltage of the microcomputer 22, the state of the power supply FET 20, the output voltage of the comparator 23, and the switch current. Time is shown on the horizontal axis of these transitions. In FIG. 7 as well, the high-level voltage and the low-level voltage are indicated by H and L, respectively.

In the second embodiment, when the power supply FET 20 is off, the circuit FET 40 is also off. When the circuit FET 40 is off, the divided voltage divided by the resistor circuit 24 and the detection resistor 26 exceeds the predetermined voltage Vr as described above. Accordingly, the output voltage of the comparator 23 is a low-level voltage. When the power supply FET 20 is on, the change in the output voltage of the comparator 23 is the same as the change in the first embodiment. The change in the output voltage of the microcomputer 22 and the change in the state of the power supply FET 20 are the same as the change in the first embodiment. Accordingly, when the switch current flowing through the power supply FET 20 exceeds the current threshold while the output voltage of the microcomputer 22 is a high-level voltage, the output voltage of the comparator 23 is switched from the high-level voltage to the low-level voltage, and the drive circuit 21 switches off the power supply FET 20.

Effect of Parallel Resistor 42

Figure 8:
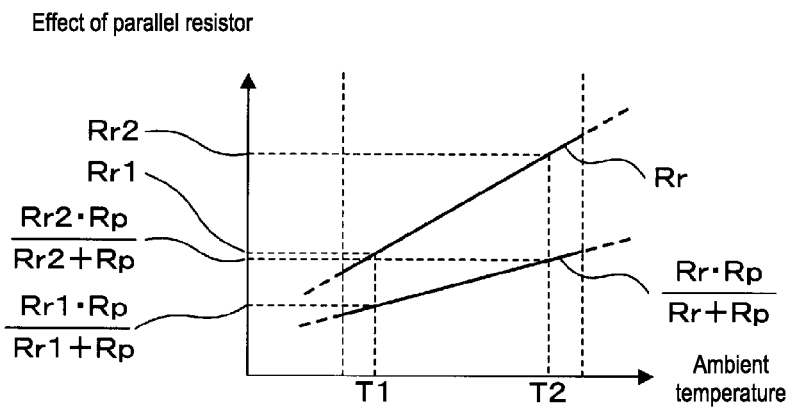
FIG. 8 is an illustrative diagram of an effect of a parallel resistor.

FIG. 8 is an illustrative diagram of the effect of the parallel resistor 42. FIG. 8 shows the relationship between the on-resistance value Rr of the circuit FET 40 and the ambient temperature of the power supply FET 20. Furthermore, FIG. 8 shows the relationship between the resistance value of the parallel circuit of the circuit FET 40 and the parallel resistor 42 and the ambient temperature of the power supply FET 20. Here, the resistance value of the parallel circuit is the resistance value when the circuit FET 40 is on.

The resistance value of the parallel circuit of the circuit FET 40 and the parallel resistor 42 is (Rr Rp/(Rr+Rp)), which is lower than the on-resistance value Rr of the circuit FET 40. Accordingly, by connecting the parallel resistor 42 in parallel to the circuit FET 40, the resistance value drops from Rr to (Rr Rp/(Rr+Rp)). The on-resistance value of the circuit FET 40 when the ambient temperature of the power supply FET 20 is a first temperature T1 is denoted as Rr1. The on-resistance value of the circuit FET 40 when the ambient temperature of the power supply FET 20 is a second temperature T2 is denoted as Rr2. The on-resistance value Rr of the circuit FET 40 is larger the higher the ambient temperature of the power supply FET 20 is, as in the first embodiment. Since the second temperature T2 is higher than the first temperature T1, the on-resistance value Rr2 is greater than the on-resistance value Rr1.

When the ambient temperature of the power supply FET 20 is the first temperature T1, the resistance value of the parallel circuit is represented by (Rr1·Rp/(Rr1+Rp)). By connecting the parallel resistor 42 in parallel to the circuit FET 40, the resistance value drops from Rr1 to (Rr1·Rp/(Rr1+Rp)). Similarly, when the ambient temperature of the power supply FET 20 is the second temperature T2, the resistance value of the parallel circuit is expressed by (Rr2 Rp/(Rr2+Rp)). By connecting the parallel resistor 42 in parallel to the circuit FET 40, the resistance value drops from Rr2 to (Rr2 Rp/(Rr2+Rp)).

The decrease in the resistance value when the ambient temperature of the power supply FET 20 is the second temperature T2 is larger than the decrease in the resistance value when the ambient temperature of the power supply FET 20 is the first temperature T1. For example, it is assumed that the on-resistance value Rr1, the on-resistance value Rr2, and the resistance value Rp are 5 ohms, 10 ohms, and 5 ohms, respectively. When the ambient temperature of the power supply FET 20 is the second temperature T2, the resistance value drops from 10 ohms to 3.33 (=10/3) ohms, and the decrease amount is 6.66 (=20/3) ohms. When the ambient temperature of the power supply FET 20 is the first temperature T1, the resistance value drops from 5 ohms to 2.5 ohms, and the decrease amount is 2.5 ohms.

In the second embodiment, the resistance value of the parallel circuit is denoted as Rr again. Also, within the range of the pre-set ambient temperature, the relationship between the resistance value of the parallel circuit and the ambient temperature of the power supply FET 20 is expressed by the following approximate expression.

$$Rr = Cr \cdot T + Br$$

Here, T is the ambient temperature of the power supply FET 20. Cr is a positive constant. Br is a constant.

The resistance value Rc of the series resistance 41 is determined to be ((Cr·Ba/Ca)−Br) as in the first embodiment. As a result, a configuration is realized in which the current threshold value is constant regardless of the ambient temperature T of the power supply FET 20. In this case, the following equation holds true as in the first embodiment.

$$Rt/Ra = Cr/Ca$$

As described in the description of the first embodiment, each of Ba and Ca is a constant used in the approximate expression of the on-resistance value Ra of the power supply FET 20. Rt is the resistance value of the resistor circuit 24.

When the second embodiment is compared with the first embodiment, the constant Cr can be reduced by connecting the parallel resistance 42 in parallel to the circuit FET 40. As a result, the ratio between the resistance value Rt of the resistor circuit 24 and the on-resistance value Ra of the power supply FET 20 can be adjusted.

As described in the description of the first embodiment, the ratio between the resistance value Rt of the resistor circuit 24 and the on-resistance value Ra of the power supply FET 20 is also expressed by the following equation.

$$Rt/Ra = Rs \cdot Ig/Vr$$

As described in the description of the first embodiment, Rs, Ig, and Vr are respectively the resistance value, the target current, and the predetermined voltage of the detection resistor 26.

After determining the resistance value Rc of the series resistor 41, the resistance value Rs of the detection resistor 26, the target current Ig, and the predetermined voltage Vr are determined such that Rt/Ra=Rs Ig/Vr is satisfied. In the second embodiment, since the constant Cr can be adjusted, the resistance value Rs, the target current Ig, and the predetermined voltage Vr of the detection resistor 26 can be easily determined to desired values.

Effect of Power Supply Control Apparatus 10

The power supply control apparatus 10 according to the second embodiment similarly exhibits the effect of the power supply control apparatus 10 according to the first embodiment.

Third Embodiment

In the resistor circuit 24 according to the second embodiment, the circuit FET 40, that is, a semiconductor switch, is used as an element whose resistance value changes according to the ambient temperature of the power supply FET 20. However, the element whose resistance value changes according to the ambient temperature of the power supply FET 20 is not limited to the semiconductor switch.

Hereinafter, the differences between the third embodiment and the second embodiment will be described. Other configurations except the later-described configurations are the same as those in the second embodiment. For this reason, the configurational parts that are the same as those in the second embodiment are denoted by the same reference numerals as those in the second embodiment, and description thereof is omitted.

Figure 9:
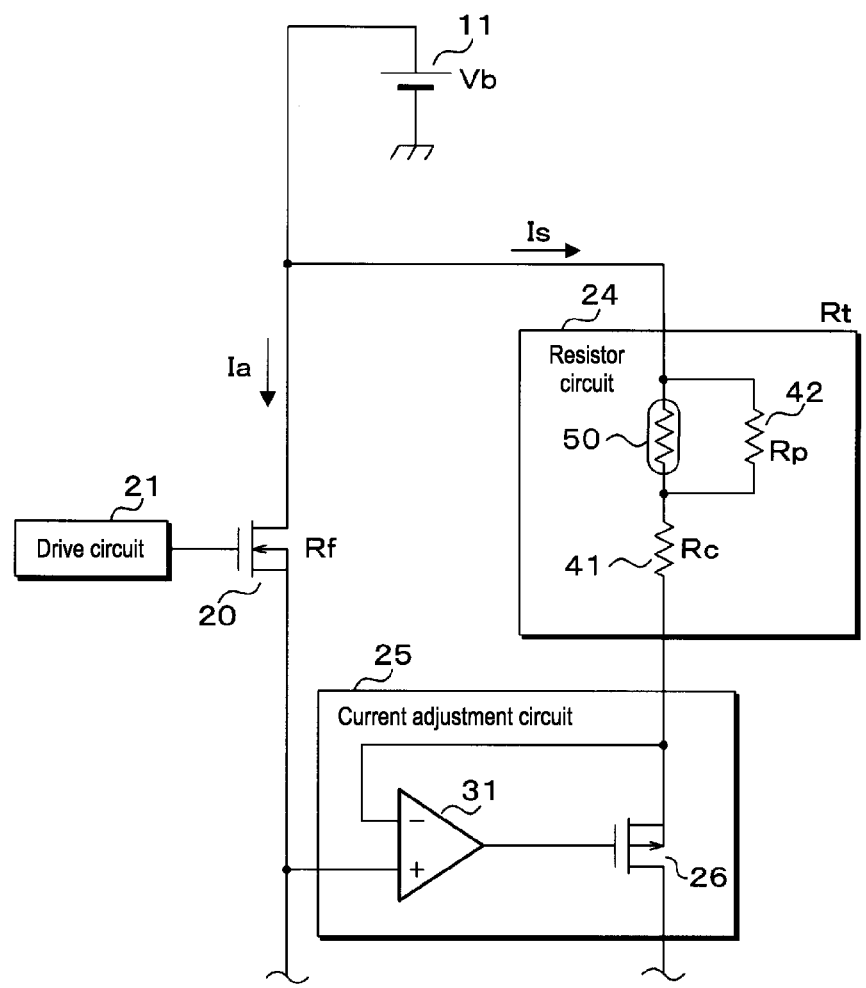
FIG. 9 is a circuit diagram of a resistor circuit according to a third embodiment.

FIG. 9 is a circuit diagram of the resistor circuit 24 according to the third embodiment. The resistor circuit 24 according to the third embodiment has a series resistor 41 and a parallel resistor 42, similarly to the second embodiment. The resistor circuit 24 in the third embodiment has a thermistor 50 instead of the circuit FET 40. The resistance value of the thermistor 50 increases when the temperature of the thermistor 50 rises. The thermistor 50 is arranged in the vicinity of the power supply FET 20. For this reason, when the ambient temperature of the power supply FET 20 rises, the temperature of the thermistor 50 rises. As a result, the resistance value of thermistor 50 increases.

One terminal of the thermistor 50 is connected to the drain of the power supply FET 20. The other terminal of the thermistor 50 is connected to one terminal of the series resistor 41. The parallel resistor 42 is connected in parallel to the thermistor 50. The resistance value of the thermistor 50 corresponds to the on-resistance value of the circuit FET 40 according to the second embodiment. One terminal of the thermistor 50 is the input terminal of the resistor circuit 24. The other terminal of the series resistor 41 is the output terminal of the resistor circuit 24, as in the second embodiment. In the third embodiment, the resistor circuit 24 does not have a control terminal.

Operations of Power Supply Control Apparatus 10

In the third embodiment, the drive circuit 21 is not connected to the resistor circuit 24, and the resistance value of the resistor circuit 24 does not change according to the output voltage of the drive circuit 21. The resistance value of the thermistor 50 corresponds to the on-resistance value Rr of the circuit FET 40 in the second embodiment. A thermistor whose resistance value changes linearly within a pre-set ambient temperature range is used as the thermistor 50. The resistance value of the resistor circuit 24 corresponds to the resistance value Rt in the second embodiment. When the power supply FET 20 is off, the resistance value between the drain and the source of the adjustment FET 30 is sufficiently small, and therefore the voltage across the DC power source 11 is divided by the resistor circuit 24 and the detection resistor 26. The divided voltage obtained by dividing the voltage across the DC power source 11 is applied to the negative terminal of the comparator 23. The divided voltage when the power supply FET 20 is off exceeds the predetermined voltage Vr. Accordingly, the operations of the power supply control apparatus 10 are the same as those of the second embodiment.

Effect of Power Supply Control Apparatus 10

The power supply control apparatus 10 according to the third embodiment similarly exhibits the effect of the power supply control apparatus 10 according to the second embodiment.

Fourth Embodiment

In the resistor circuit 24 of the power supply control apparatus 10 in the second embodiment, the parallel resistor 42 is connected in parallel to the circuit FET 40. However, the location where the parallel resistor 42 is connected is not limited to the drain and source of the circuit FET 40.

Hereinafter, the differences between the fourth embodiment and the second embodiment will be described. Other configurations except the later-described configurations are the same as those in the second embodiment. For this reason, the configurational parts that are the same as those in the second embodiment are denoted by the same reference numerals as those in the second embodiment, and description thereof is omitted.

Figure 10:
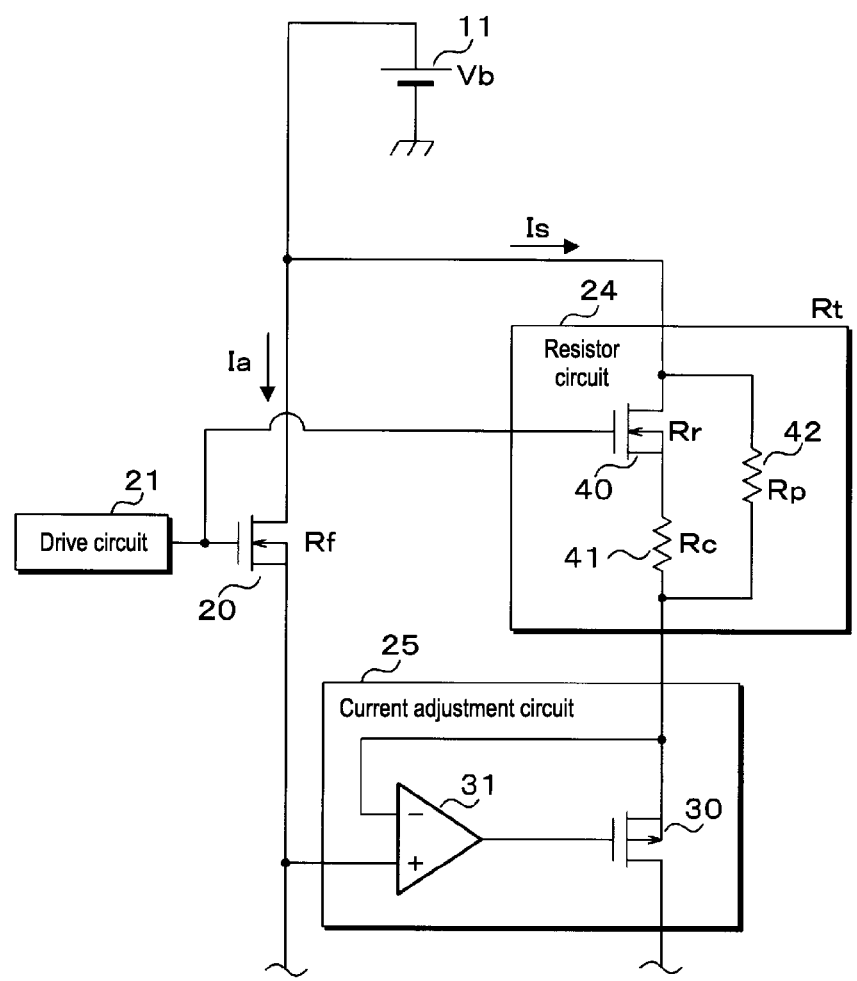
FIG. 10 is a circuit diagram of a resistor circuit according to a fourth embodiment.

FIG. 10 is a circuit diagram of the resistor circuit 24 in the fourth embodiment. As shown in FIG. 10, in the resistor circuit 24 in the fourth embodiment, the parallel resistor 42 is connected in parallel to the series circuit of the circuit FET 40 and the series resistor 41.

In the fourth embodiment, similarly to the second embodiment, the resistor current flows through the resistor circuit 24 not only when the circuit FET 40 is on but also when the circuit FET 40 is off. The resistance value of the series circuit when the circuit FET 40 is on is denoted as Rf. Here, the series circuit is a circuit in which the series resistor 41 is connected in series to the circuit FET 40. The resistance value Rf is represented by (Rr+Rc). As described in the description of the first embodiment, Rr and Rc are the on-resistance value of the circuit FET 40 and the resistance value of the series resistor 41, respectively.

The resistance value Rt of the resistor circuit 24 is (Rf·Rp/(Rf+Rp)). As described in the description of the second embodiment, Rp is the resistance value of the parallel resistor 42. Rt is the resistance value of the resistor circuit 24 when the circuit FET 40 is on. The resistance value of the resistor circuit 24 when the circuit FET 40 is off is Rp.

Operations of Power Supply Control Apparatus 10

As described in the second embodiment, when the power supply FET 20 is off, the resistance value between the drain and the source of the adjustment FET 30 is adjusted to a sufficiently small value. When the power supply FET 20 is off, the circuit FET 40 is off and the voltage across the DC power source 11 is divided by the resistor circuit 24 and the detection resistor 26. The divided voltage obtained by dividing the voltage across the DC power source 11 is applied to the negative terminal of the comparator 23. The divided voltage when the circuit FET 40 is off exceeds the predetermined voltage Vr. Accordingly, the operations of the power supply control apparatus 10 are the same as those of the second embodiment (see FIG. 7).

Effect of Series Resistor 41

As shown in FIG. 5, the resistance value Rf of the series circuit when the circuit FET 40 is on is represented by (Rr+Rc) and exceeds the on-resistance value Rr of the circuit FET 40. Here, the series circuit is a circuit in which the series resistor 41 is connected in series to the circuit FET 40. The larger the resistance value Rc of the series resistor 41 is, the larger the resistance value Rf of the series circuit is. By adjusting the resistance value Rc of the series resistor 41, the minimum value of the resistance value Rt of the resistor circuit 24 within the pre-set ambient temperature range can be adjusted.

Effect of Parallel Resistor 42

In the description of the effect of the parallel resistor 42 in the second embodiment (see FIG. 8), the on-resistance value Rr of the circuit FET 40 is replaced with the resistance value Rf of the series circuit of the circuit FET 40 and the series resistor 41, whereby the effect of the parallel resistor 42 in the fourth embodiment can be described. By adjusting the resistance value of the parallel resistor 42, the slope of the resistance value Rt of the resistor circuit 24, which rises according to the ambient temperature of the power supply FET 20, can be adjusted. As described in the description of the first embodiment, the resistance value Rt is the resistance value of the resistor circuit 24 when the circuit FET 40 is on.

Parameter Design

An example of parameter design is described. The resistance value Rc of the series resistor 41 and the resistance value Rp of the parallel resistor 42 are determined such that the resistance value Rt of the resistor circuit 24 satisfies the following equation irrelative to the ambient temperature of the power supply FET 20. D is a positive constant.

$$Rt/Ra=D$$

As described in the description of the first embodiment, Ra is represented by (Ca·T+Ba). As described in the description of the first embodiment, T is the ambient temperature of the power supply FET 20. Ca is a positive constant. Ba is a constant. The resistance value Rc of the series resistor 41 and the resistance value Rp of the parallel resistor 42 are determined such that the resistance value Rt of the resistor circuit 24 satisfies the following equation.

$$Rt=D\cdot(Ca\cdot T+Ba)$$

As described in the description of the first embodiment, Rt/Ra is represented by (Rs·Ig/Vr). Rs, Ig, and Vr are the resistance value, target current, and predetermined voltage of the detection resistor 26, respectively. The resistance value Rs, the target current Ig, and the predetermined voltage Vr of the detection resistor 26 may be determined such that the following equation is satisfied.

$$Rs\cdot Ig/Vr=D$$

Effect of Power Supply Control Apparatus 10

As in the second embodiment, the on-resistance value of the power supply FET 20 and the resistance value of the resistor circuit 24 fluctuate in the same direction according to the ambient temperature of the power supply FET 20, and therefore the drive circuit 21 can switch off the power supply FET 20 at an appropriate timing.

It is assumed that the ratio between the on-resistance value of the power supply FET 20 and the on-resistance value of the circuit FET 40 is not constant regardless of the ambient temperature. Even in this case, as with the power supply control apparatus 10, by connecting the series resistor 41 in series to the circuit FET 40, and connecting the parallel resistor 42 in parallel to the series circuit, it is possible to realize a configuration in which the ratio between the on-resistance value of the power supply FET 20 and the resistance value of the resistor circuit 24 is constant regardless of the ambient temperature of the power supply FET 20.

Modified Example

In the resistor circuit 24 according to the second embodiment, the parallel resistor 42 may be connected in parallel to the series circuit of the circuit FET 40 and a resistor (not shown). In this case, the series resistor 41 is connected in series to the series circuit. Similarly, in the resistor circuit 24 according to the third embodiment, the parallel resistor 42 may be connected in parallel to the series circuit of the thermistor 50 and the resistance (not shown). In this case as well, the series resistor 41 is connected in series to the series circuit. In the fourth embodiment, the thermistor 50 may be used instead of the circuit FET 40 as in the third embodiment.

In the first embodiment, when the ratio between the on-resistance value of the circuit FET 40 and the on-resistance value of the power supply FET 20 is constant regardless of the ambient temperature of the power supply FET 20, the resistor circuit 24 need not have the series resistor 41. In this case, the source of the circuit FET 40 is the output terminal of the resistor circuit 24 and is connected to the source of the adjustment FET 30 of the current adjustment circuit 25.

In the first embodiment, the thermistor 50 may be used instead of the circuit FET 40 as in the third embodiment.

In the second embodiment, if the ratio between the resistance value of the parallel circuit of the circuit FET 40 and the parallel resistor 42 and the on-resistance value of the power supply FET 20 is constant regardless of the ambient temperature of the power supply FET 20, the resistor circuit 24 need not have the series resistor 41. Here, the resistance value of the parallel circuit of the circuit FET 40 and the parallel resistor 42 is the resistance value when the circuit FET 40 is on. If the resistor circuit 24 does not have the series resistor 41, the source of the circuit FET 40 is the output terminal of the resistor circuit 24 and is connected to the source of the adjustment FET 30 of the current adjustment circuit 25.

Similarly, in the third embodiment, if the ratio between the resistance value of the parallel circuit of the thermistor 50 and the parallel resistor 42 and the on-resistance value of the power supply FET 20 is constant regardless of the ambient temperature of the power supply FET 20, the resistor circuit 24 need not have the series resistor 41. In this case, the other terminal of the thermistor 50 is connected to the source of the adjustment FET 30 of the current adjustment circuit 25.

In the first, second, and fourth embodiments, the switch included in the resistor circuit 24 may be a semiconductor switch whose on-resistance value fluctuates in the same direction as the on-resistance value of the power supply FET 20 according to the ambient temperature of the power supply FET 20. For this reason, the switch included in the resistor circuit 24 in the first, second, and fourth embodiments is not limited to the circuit FET 40, that is, an N-channel MOSFET, and may be an N-channel FET different from a MOSFET, a P-channel FET, an IGBT (Insulated Gate Bipolar Transistor), or the like.

In the first to fourth embodiments, the switch connected between the DC power source 11 and the load 12 may be a semiconductor switch, and is not limited to the power supply FET 20, that is, the N-channel MOSFET. The switch connected between the DC power source 11 and the load 12 may be, for example, an IGBT.

In the first to fourth embodiments, the variable resistor included in the current adjustment circuit 25 is not limited to the adjustment FET 30, that is, the P-channel type FET. The variable resistor may be, for example, a PNP-type bipolar transistor. In this case, the emitter, collector, and base of the bipolar transistor respectively corresponds to the source, drain, and gate of the adjustment FET 30.

The disclosed first to fourth embodiments should be considered as exemplary in all respects and not limiting. The scope of the present invention is indicated not by the above-described meaning, but by the claims, and is intended to include all changes within the meaning and scope equivalent to the claims.

The invention claimed is:

1. A power supply control apparatus for controlling power supply by switching on or off a semiconductor switch through which current flows, the power supply control apparatus comprising:
   a resistor circuit with one terminal connected to one terminal on an upstream side of the semiconductor switch;
   a current adjustment circuit configured to adjust a current flowing through the resistor circuit to a value obtained by dividing a voltage across the semiconductor switch by a resistance value of the resistor circuit;
   a resistor arranged on a current path of the current flowing through the resistor circuit; and a drive circuit configured to switch off the semiconductor switch if the voltage across the resistor exceeds a predetermined voltage, wherein an on-resistance value of the semiconductor switch fluctuates according to an ambient temperature of the semiconductor switch, and the resistance value of the resistor circuit fluctuates in the same direction as the on-resistance value according to the ambient temperature.

2. The power supply control apparatus according to claim 1, wherein the resistor circuit includes a second semiconductor switch, the drive circuit switches on the second semiconductor switch if the semiconductor switch has been switched on, and the on-resistance value of the second semiconductor switch fluctuates in the same direction as the on-resistance value of the semiconductor switch according to the ambient temperature of the semiconductor switch.

3. The power supply control apparatus according to claim 2, wherein the resistor circuit includes a series resistor that is connected in series to the second semiconductor switch.

4. The power supply control apparatus according to claim 2, wherein the resistor circuit includes a parallel resistor that is connected in parallel to a series circuit of the second semiconductor switch and a series resistor.

5. The power supply control apparatus according to claim 2, wherein the resistor circuit includes a parallel resistor that is connected in parallel to the second semiconductor switch.

6. The power supply control apparatus according to claim 1, wherein the current adjustment circuit includes:

a variable resistor; and a resistance adjustment unit configured to adjust a resistance value of the variable resistor such that voltages at terminals on a downstream side of the semiconductor switch and the resistor circuit match each other.

7. The power supply control apparatus according to claim 3, wherein the resistor circuit includes a parallel resistor that is connected in parallel to the second semiconductor switch.

8. The power supply control apparatus according to claim 2, wherein the current adjustment circuit includes:

a variable resistor; and a resistance adjustment unit configured to adjust a resistance value of the variable resistor such that voltages at terminals on a downstream side of the semiconductor switch and the resistor circuit match each other.

9. The power supply control apparatus according to claim 3, wherein the current adjustment circuit includes:

a variable resistor; and a resistance adjustment unit configured to adjust a resistance value of the variable resistor such that voltages at terminals on a downstream side of the semiconductor switch and the resistor circuit match each other.

10. The power supply control apparatus according to claim 4, wherein the current adjustment circuit includes:

a variable resistor; and a resistance adjustment unit configured to adjust a resistance value of the variable resistor such that voltages at terminals on a downstream side of the semiconductor switch and the resistor circuit match each other.

11. The power supply control apparatus according to claim 5, wherein the current adjustment circuit includes:

a variable resistor; and a resistance adjustment unit configured to adjust a resistance value of the variable resistor such that voltages at terminals on a downstream side of the semiconductor switch and the resistor circuit match each other.

* * * * *